United States Patent
Johnson et al.

(10) Patent No.: US 9,391,568 B2
(45) Date of Patent: Jul. 12, 2016

(54) PROCESS DEVICE WITH LIGHT CHANGE TRIGGERED DISPLAY

(75) Inventors: James Johnson, Savage, MN (US); Richard Nelson, Chanhassen, MN (US)

(73) Assignee: Rosemount Inc., Eden Prairie, MN (US)

( * ) Notice: Subject to any disclaimer, the term of this patent is extended or adjusted under 35 U.S.C. 154(b) by 844 days.

(21) Appl. No.: 13/068,611

(22) Filed: May 16, 2011

(65) Prior Publication Data

US 2012/0293015 A1    Nov. 22, 2012

(51) Int. Cl.
    *H03F 3/08*  (2006.01)
    *G06F 3/147*  (2006.01)

(52) U.S. Cl.
    CPC  *H03F 3/08* (2013.01); *G06F 3/147* (2013.01); *G09G 2330/021* (2013.01); *G09G 2360/144* (2013.01); *Y10T 307/773* (2015.04)

(58) Field of Classification Search
    CPC .................................................. Y10T 307/773
    USPC .................................................. 307/112, 117
    See application file for complete search history.

(56) References Cited

U.S. PATENT DOCUMENTS

| | | | |
|---|---|---|---|
| 5,012,667 A | 5/1991 | Kruse | |
| 7,134,354 B2 * | 11/2006 | Nelson et al. | 73/866.3 |
| 7,164,355 B2 | 1/2007 | Schnaare et al. | |
| 7,426,452 B2 * | 9/2008 | Zielinski et al. | 702/184 |
| 7,680,460 B2 * | 3/2010 | Nelson et al. | 455/67.11 |
| 7,768,530 B2 * | 8/2010 | Sigtermans et al. | 345/619 |
| 7,957,762 B2 * | 6/2011 | Herz et al. | 455/550.1 |
| 8,160,535 B2 * | 4/2012 | Kielb et al. | 455/343.1 |
| 8,334,788 B2 * | 12/2012 | Hausler et al. | 340/870.02 |
| 8,401,513 B2 * | 3/2013 | Langereis et al. | 455/401 |
| 8,538,560 B2 * | 9/2013 | Brown et al. | 700/22 |
| 8,570,260 B2 * | 10/2013 | Hedtke et al. | 345/87 |
| 8,600,430 B2 * | 12/2013 | Herz et al. | 455/550.1 |
| 8,752,922 B2 * | 6/2014 | Lamontagne et al. | 347/3 |
| 2003/0020629 A1 * | 1/2003 | Swartz | G06F 1/163 340/4.41 |
| 2005/0056106 A1 * | 3/2005 | Nelson et al. | 73/866.3 |
| 2005/0190142 A1 * | 9/2005 | Ferguson | 345/102 |
| 2005/0245291 A1 | 11/2005 | Brown et al. | |
| 2007/0085157 A1 | 4/2007 | Fadell et al. | |
| 2007/0195074 A1 | 8/2007 | Gelissen | |
| 2008/0180276 A1 * | 7/2008 | Sigtermans et al. | 340/870.16 |
| 2008/0284716 A1 | 11/2008 | Edwards et al. | |

(Continued)

FOREIGN PATENT DOCUMENTS

| | | |
|---|---|---|
| CN | 1950770 A | 4/2007 |
| CN | 101331532 A | 12/2008 |

(Continued)

OTHER PUBLICATIONS

International Search Report and Written Opinion of PCT Application Serial No. PCT/US2012/037739, dated Oct. 25, 2012, 9 pages.

(Continued)

*Primary Examiner* — Adi Amrany
(74) *Attorney, Agent, or Firm* — Kinney & Lange, P.A.

(57) ABSTRACT

A field device comprises a transducer, a photodetector, a display, and a display controller. The transducer controls or monitors process variable, and the display shows information relating to the process variable. The photodetector detects a light level. The display controller is capable of switching the display on and off in response to changes in the light level detected by the photodetector.

21 Claims, 3 Drawing Sheets

(56) References Cited

U.S. PATENT DOCUMENTS

| | | | |
|---|---|---|---|
| 2009/0027652 A1* | 1/2009 | Chang et al. | 356/4.01 |
| 2010/0109331 A1 | 5/2010 | Hedtke et al. | |
| 2010/0130875 A1 | 5/2010 | Banet et al. | |
| 2010/0181467 A1* | 7/2010 | Chang | 250/221 |
| 2010/0181506 A1* | 7/2010 | Brutschin et al. | 250/551 |
| 2010/0207913 A1 | 8/2010 | Hedtke et al. | |
| 2010/0313125 A1* | 12/2010 | Fleizach | G06F 3/04883 715/702 |
| 2011/0003614 A1* | 1/2011 | Langereis et al. | 455/550.1 |
| 2011/0086676 A1* | 4/2011 | Choi et al. | 455/567 |
| 2011/0118890 A1* | 5/2011 | Parsons | H02J 3/14 700/295 |
| 2011/0249134 A1* | 10/2011 | Dennison-Gibby et al. | 348/222.1 |
| 2011/0273860 A1* | 11/2011 | Corvese et al. | 361/816 |
| 2012/0187000 A1* | 7/2012 | Kahn et al. | 205/782 |
| 2012/0300420 A1* | 11/2012 | Muldowney et al. | 361/752 |

FOREIGN PATENT DOCUMENTS

| | | |
|---|---|---|
| DE | 102008047422 A1 | 4/2010 |
| EP | 0 980 055 A1 | 2/2000 |
| JP | H056259 A | 1/1993 |
| JP | H05287643 A | 11/1993 |
| JP | H1096890 A | 4/1998 |
| JP | 2002147840 A | 5/2002 |
| JP | 2008500659 A | 1/2008 |
| JP | 2009501319 A | 1/2009 |
| RU | 2372672 C1 | 11/2009 |
| RU | 2389056 C2 | 5/2010 |

OTHER PUBLICATIONS

Anonymous: "Backlight Disable Under High Ambient Illumination", Research Disclosure, Mason Publications, Hampshire, GB—vol. 365, No. 48, Sep. 1, 1994, XP007119985, 1 page.

Extended European Search Report from EP Application Serial No. 12786036.9, Dated Feb. 25, 2015, 11 pages.

First Office Action from Chinese Application No. 201280023825.4, Dated Aug. 5, 2015, 26 pages.

Notice of Reasons for Refusal for Application Serial No. 2014-511439, dated Jan. 15, 2016, 6 pages.

Office Action from Russian Patent Application No. 2013155557, Dated Mar. 16, 2016, 11 pages.

* cited by examiner

PROCESS DEVICE WITH LIGHT CHANGE TRIGGERED DISPLAY

BACKGROUND

The present invention relates generally to wireless devices for use in industrial process control systems. More particularly, the present invention relates to power conservation for field devices with built-in displays.

Process monitoring systems monitor and control process parameters in an industrial setting, such as pressure, temperature, flow, and level of process fluids used in industrial processes. For example, sensors coupled to transmitters are often employed at multiple locations in industrial manufacturing facilities to monitor and report a variety of process parameters along various production lines, while actuators coupled to receivers are used in other areas to, for instance, open and close valves in accordance with signals from a central control center.

Wireless devices are becoming prevalent in industrial applications. As components of wireless field device networks, wireless devices extend the reach of control or process monitoring systems beyond that of wired devices to locations where wiring may be difficult and expensive to provide. A wireless field device network includes of a cloud of wireless devices or nodes with a central controller or gateway. The nodes in the wireless network are able to both send and receive information.

Wireless field device networks are used to control and monitor disparate processes and environments. For example, wireless field device networks may be used in oil fields. An oil field is composed of numerous discrete locations centered on well pads that are scattered over large areas. Communication between these isolated local areas is essential to the overall management of the field. The wireless field device network at a well pad monitors and controls everything from flow rates and fluid temperature to valve status and position and potential leaks. The resulting data is relayed through the network to controllers that analyze the data and actuate control mechanisms in order to manage production or prevent trouble.

The term "field device" refers to any device mounted on industrial apparatus to perform a function in a process control system, including devices used in the measurement, control and monitoring of industrial plants, processes, or process equipment, including plant environmental, health, and safety devices. Each field device typically includes a sensor, an actuator, or both, and may perform a control or alert function. In wireless network systems designed for sensor/actuator-based applications, many devices in the network may be locally-powered because power utilities, such as 120V AC utilities or powered data buses, are not located nearby or are not allowed into hazardous locations where instrumentation, sensors, and actuators and safety monitors or human interface devices must be located without incurring great installation expense. "Locally-powered" means powered by a local power source, such as a self-contained electrochemical source (e.g., long-life batteries or fuel cells) or by a low-power energy-scavenging power source (e.g., vibration, solar, or thermoelectric). A common characteristic of local power sources is their limited energy capacity or limited power capacity, either stored, as in the case of a long-life battery, or produced, as in the case of a solar panel. Often, the economic need for low installation cost drives the need for battery-powered devices communicating as part of a wireless field device network. Effective utilization of a limited power source, such as a primary cell battery which cannot be recharged, is vital for a well functioning wireless field device. Batteries are expected to last more than five years and preferably last as long as the life of the product.

Some field devices incorporate a local operator interface (LOI) to facilitate maintenance and monitoring in the field. LOIs allow technicians to check process parameters and verify that field devices are working properly, in situ. A LOI may include a display such as a liquid crystal display (LCD). The power requirements of LOIs are modest, but are an important consideration for locally-powered devices, since continuously powering a display will unnecessarily drain a limited power supply. Because an LOI display may be needed only occasionally (e.g. while the field device is being locally checked by a technician), some field devices allow technicians to turn displays on or off with a button, thereby conserving power when the display is not in use.

SUMMARY

One embodiment of the present invention is a field device with a transducer, a photodetector, a display, and a display controller. The transducer controls or monitors a process variable, and the display shows information relating to the process variable. The display controller can switch the display on or off in response to changes in a light level detected by the photodetector.

DETAILED DESCRIPTION

A field device with a photodetector and an integral local operator interface display is provided. By powering the display only briefly in response to a change in light level detected by the photodetector, the display can draw power on an as-needed basis.

Figure 1:
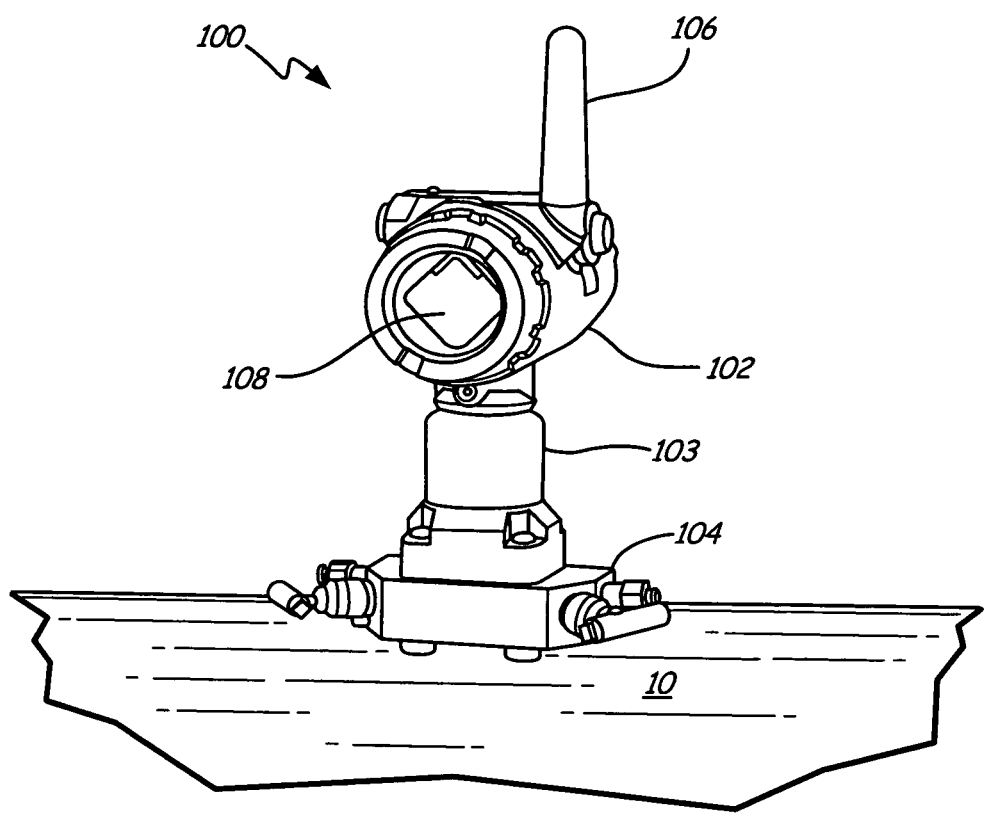
FIG. 1 is an perspective view of a locally powered field device with a light level sensing control for turning a local operator interface on or off.

FIG. 1 is a perspective view of field device 100, which includes electronics housing 102, transducer housing 103, process connection 104, antenna 106, and local operator interface (LOI) 108, and is attached to process system 10. Electronics housing 102 seals and protects the components of field device 100, and is affixed to transducer housing 103, which contains sensors or actuators to monitor or control one or more parameters of process system 10, as discussed below. Field device 100 is attached to process system 10 via process connection 104, which may include valving, electrical connections, or other connections depending on the type of process monitored or controlled by field device 100. Antenna 16 transmits and receives signals between field device 100 and a controller, a wireless network such as a mesh network, a gateway, or any combination of the above. LOI 108 is a user interface with an integral display.

In one embodiment, field device 100 is a transmitter which takes sensor readings of one or more process parameters from process system 10 and reports these readings to a control or monitoring system. Field device 100 may monitor pressure, flow, vibration, current, pH, or any other measurable process parameter. In another embodiment, field device 100 is an actuator which receives command instructions from a control system, and regulates one or more parameters of process system 10 accordingly via one or more actuators. In this embodiment, field device 100 may, for instance, control speeds, open or close valves, or divert fluid flows.

LOI 108 facilitates maintenance and local monitoring of both field device 100 and process system 10. LOI 108 may include an indicator of monitored process parameters, as well as a status indicator. In one embodiment a local operator such as a maintenance technician might interact with field device 100 via a touchscreen included in LOI 108. In another embodiment, a local operator might read values from the display of LOI 108, but send inputs to field device via a remote.

Figure 2:
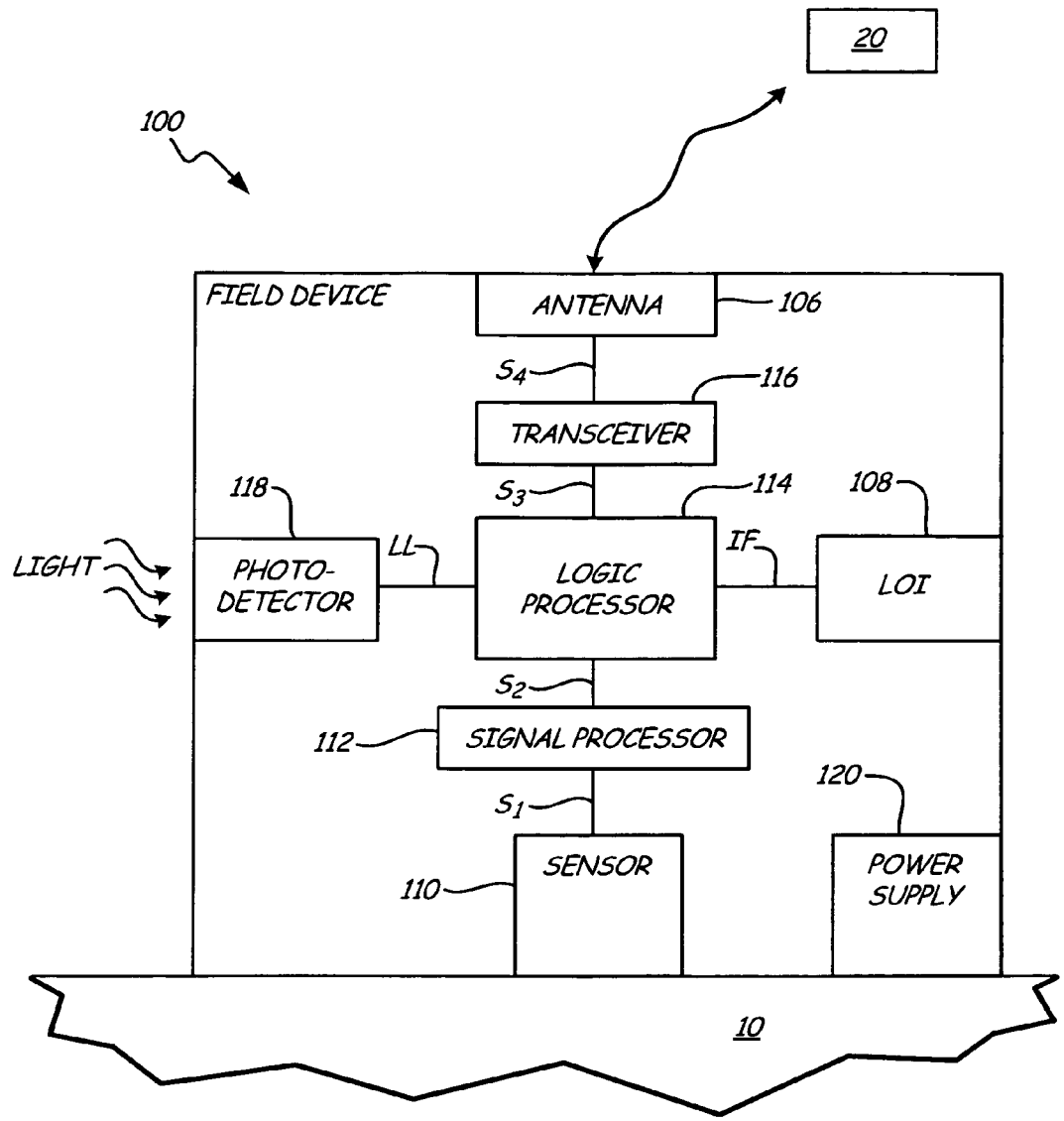
FIG. 2 is a block diagram of the locally powered field device.

FIG. 2 is a block diagram of field device 100. Field device 100 includes antenna 106, LOI 108, sensor 110, signal processor 112, logic processor 114, transceiver 116, photodetector 118, and power supply 120. Field device 100 is coupled with process system 10 via sensor 110, and is connected to network 20 via antenna 106. Sensor 110 is a transducer located in transducer housing 103 (see FIG. 1), and monitors a parameter of process system 10, such as pressure, flow, vibration, current, pH, or another measurable quantity. Sensor 110 produces sensor output $S_1$, which is converted by signal processor 112 into digital signal $S_2$. Signal processor 112 may be any sort of analog-to-digital conversion apparatus capable of converting a data signal corresponding to sensor output $S_1$. Digital signal $S_2$ is received by logic processor 114, which in one embodiment is a microprocessor. Logic processor 114 may analyze digital signal $S_2$, and will operate LOI 108, accepting and interpreting inputs from users and providing requested information to LOI 108 and to network 20, as discussed below. Logic processor 114 produces transmission signal $S_3$, which is received by transceiver 116. Transceiver 116 drives antenna 106, transmitting antenna signal $S_4$ out to network 20. Network 20 may include a mesh network, a gateway, a central system controller, or any combination of the above.

LOI 108 is controlled by logic processor 114 via interface signal IF. Interface signal IF may be bi-directional, if logic processor 114 receives inputs from 108 (as, for instance, if LOI 108 incorporates one or more buttons or touchscreens), or uni-directional, if logic processor 114 receives no inputs from LOI 108 (as, for instance, if LOT is merely a passive display, or if local users interact with field device 100 by separate means such as a wireless remote).

Photodetector 118 monitors light level at a location on the exterior of field device 110, and outputs light signal LL corresponding to a change in light level. Light signal LL is used as an interrupt to logic processor 114 to enable or disable the display of LOI 108. In one embodiment a sudden change in light level detected by photodetector 118—positive or negative—causes logic processor 114 to switch on power to the display of LOI 108. In alternative embodiments, only sudden decreases or only sudden increases in light level will cause logic processor 114 to switch the power to LOI 108 on or off. In one embodiment logic processor 114 includes a timer, and switches power to the display of LOI 108 off automatically a preset time after switching it on. In an alternative embodiment, logic processor 114 switches the display of LOI 108 off in response to a second signal, for instance from photodetector 116.

All of the aforementioned components of field device 100 receive power as necessary from power supply 120. LOI 108 is powered only as directed by logic processor 114, as described above. Power supply 120 might be a power supply with a limited lifespan, such as a battery or a fuel cell, or a power supply with limited power output, such as a system for scavenging power from process system 10 (e.g. a vibrational energy scavenger) or from the environment (e.g. a solar panel).

In an alternative embodiment of field device 100, sensor 110 might be replaced by an actuator to control one or more parameters of process system 10. The operation of this embodiment would substantially parallel the sensor version described above, except that antenna 106 would receive command signals from network 20, rather than transmitting, and these command signals would be routed through transceiver 116 to logic processor 114 in order to command actuator 110. Another alternative embodiment of field device 100 incorporates transducers including both actuators and sensors.

In some embodiments, a plurality of field devices 100 may be wirelessly connected in a network, such that each field device 100 both sends and receives signals to selected other field devices 100 via transceiver 116 and 106. In one such embodiment, a change in light level at any field device 100 causes multiple wirelessly networked field devices 100 to switch LOIs 108 on or off. To accomplish this, logic processor 114 is capable of switching power to LOI 108 on or off in response to a power signal received via antenna 106 and transceiver 116, as well as in response to light signal LL. In addition, light signals LL which cause logic processor 114 to switch power to LOT 108 on or off can also cause logic processor 114 to broadcast signals to other field devices 100 via transceiver 116 and antenna 106, indicating that these other field devices should switch their LOIs 108 on or off.

Figure 3:
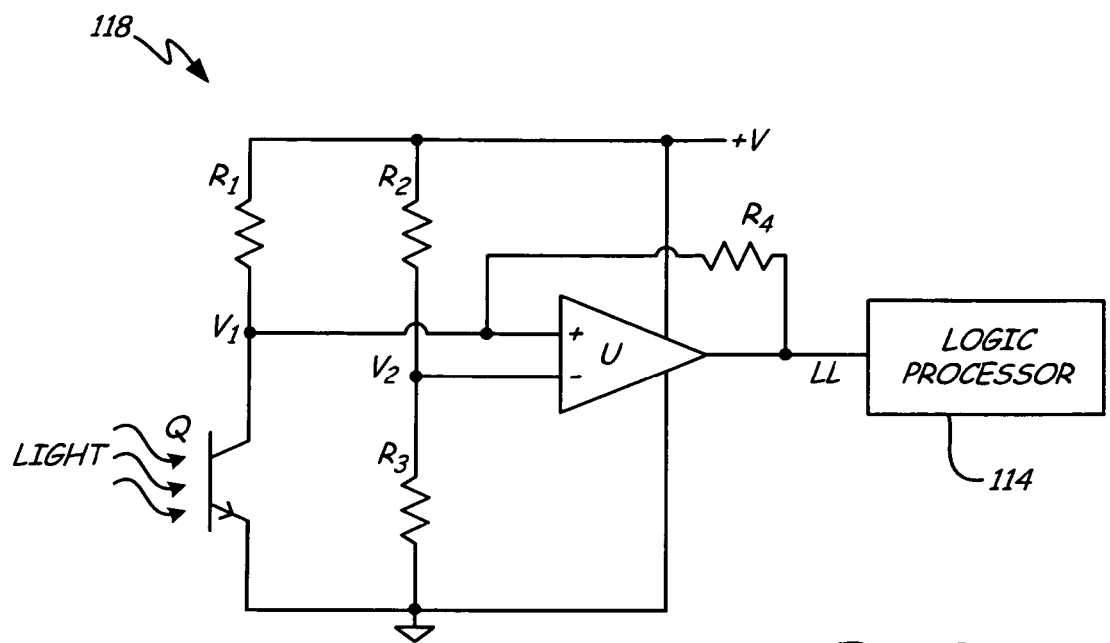
FIG. 3 is a schematic diagram of a photodetector circuit of the locally powered field device.

FIG. 3 is a schematic diagram of one embodiment of photodetector 118. Photodetector 118 includes phototransistor Q, amplifier resistors $R_1$, voltage divider resistors $R_2$ and $R_3$, feedback resistor $R_4$, and comparator U. Photodetector 118 is powered by power supply 120, and attached to circuit common as indicated. The circuit configuration in FIG. 3 can be analyzed in two stages.

The first stage of photodetector 118 is a common-emitter transistor amplifier circuit comprising phototransistor Q and amplifier resistor $R_1$. Phototransistor Q is exposed to environmental light through an aperture or window in electronics housing 102. Amplifier resistor $R_1$ is connected to the collector of phototransistor Q to form a common-emitter amplifier. Incident light on phototransistor Q produces an amplified voltage $V_1$ across phototransistor Q. Phototransistor Q approximates a switch that is "closed" when the phototransistor Q is illuminated, and "open" when phototransistor Q is dark. $V_1$ will be a logic "low" (near circuit common) when phototransistor Q is illuminated and will be a logic "high" (approximately +V) when phototransistor Q is dark.

The second stage of photodetector 118 is a comparator system comprising comparator U, voltage divider resistors $R_2$ and $R_3$, and feedback resistor $R_4$. Comparator U compares $V_1$ with a second, constant voltage $V_2$ set up by voltage divider resistors $R_2$ and $R_3$, to produce light signal LL. Feedback resistor $R_4$ is connected between the output and the noninverting input of comparator U to add hysteresis to signal LL, and to reduce noisy fluctuations due to small light transitions from phototransistor Q. Whenever $V_1$ is high, $V_1$ will exceed $V_2$, and light signal LL will be positive. Whenever $V_1$ is low, $V_2$ will exceed $V_1$, and light signal LL will be negative.

Logic processor 114 receives light signal LL from photodetector 118. Logic processor 114—which may include, for instance, an edge-triggered interrupt—detects transitions from positive to negative or negative to positive in light signal LL. When such a transition is detected, logic processor 114 turns on or turns off power to a display of LOI 108.

Previous systems have used buttons to toggle local displays on field devices on or off. Buttons and other systems with moving parts, however, can be prone to mechanical wear and breakdown. Additionally, field devices may be used in environments highly sensitive to heat, electricity, or sparking, where completely sealing the field device from the environment is advantageous, or even necessary. Sealing a field device is easier and less expensive if moving parts like buttons can be avoided. Photodetectors provide an inexpensive and reliable means of switching the power state of a display on a field device. A technician inspecting field devices can cover a photodetector (thereby darkening it), or shine a light on it (thereby illuminating it); either case would result in a transition detected by the disclosed system, and can be used to switch the display on or off.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A field device comprising:
   a transducer for controlling or monitoring a process variable;
   a photodetector for detecting a light level;
   a display configured to show information related to the process variable; and
   a display controller configured with an edge-triggered interrupt to switch the display on in response to both increases and decreases in the light level detected by the photodetector.

2. The field device of claim 1, further comprising a processor and a wireless transceiver for transmitting radio frequency signals to or from the transducer.

3. The field device of claim 1, further comprising a timer, and wherein the display controller switches off the display a fixed time after switching on the display.

4. The field device of claim 1, further comprising a wireless transceiver connected to the display controller.

5. The field device of claim 4, wherein the display controller is configured to switch the display on in response to a power signal received by the wireless transceiver.

6. The field device of claim 4, wherein the display controller is configured to broadcast a power signal to selected other field devices via the wireless transceiver whenever the power control system switches the display on in response to a change in light level, the power command instructing other field devices to switch their displays on.

7. The field device of claim 1, wherein the display is a liquid crystal display.

8. The field device of claim 1, further comprising a local power supply.

9. The field device of claim 8, wherein the local power supply includes at least one of a battery or an energy scavenging system.

10. The field device of claim 1, wherein the photodetector comprises a first stage sensor system configured to produce an amplified voltage signal from a phototransistor, and a second stage comparator system configured to produce a light level signal indicative of sudden light level changes based on transitions in the amplified voltage signal, and further wherein the display controller is configured to switch the display on in response to the light level signal.

11. A field device comprising:
    a radio antenna for transmitting and receiving radio frequency signals;
    a processor for processing digital signals;
    a transceiver connecting the processor and radio antenna, the transceiver translating between the radio frequency signals and digital signals;
    a local power supply powering the field device;
    a photodetector configured to detect a light level and produce a corresponding light level signal indicative of sudden changes in light level; and
    a display for showing information related to a process variable, and which is switched on by the processor in an edge-triggered response to transitions of the light level signal between light and dark, regardless of subsequent light level.

12. The field device of claim 11, wherein the transition of the light level is an increase, such that the display controller switches the display on when the photodetector is illuminated or uncovered.

13. The field device of claim 11, wherein the transition of the light level is a decrease, such that the display controller switches the display on when the photodetector is darkened or covered.

14. The field device of claim 11, further comprising a transducer connected to the processor, the transducer configured to monitor or control an industrial process.

15. The field device of claim 11, wherein the processor switches the display on in response both to sudden increases and to sudden decreases in light level.

16. The field device of claim 11, further comprising a timer, and wherein the processor switches the display off a fixed time after switching the display on.

17. The field device of claim 11, wherein the processor broadcasts a display control power signal to selected other field devices via the transceiver and radio antenna whenever the processor switches the display on in response to a change in light level, the power signal instructing selected other field devices to switch their displays on.

18. The field device of claim 11, wherein the local power supply includes at least one of a battery or an energy scavenging system.

19. The field device of claim 11, further comprising a sensor connected to the processor, wherein the transceiver is a transmitter and the radio frequency signal represents a reading of the sensor.

20. The field device of claim 11, and further comprising an actuator connected to the processor, wherein the transceiver is a receiver, and the radio frequency signal is a control signal for the actuator.

21. The field device of claim 11, wherein the photodetector comprises a first stage sensor system configured to produce an amplified voltage signal from a phototransistor, and a second stage comparator system configured to produce the light level signal based on transitions in the amplified voltage signal.

* * * * *